United States Patent [19]

Cutchaw

[11] 4,164,003
[45] Aug. 7, 1979

[54] INTEGRATED CIRCUIT PACKAGE AND CONNECTOR THEREFOR

[76] Inventor: John M. Cutchaw, 7333 E. Virginia, Scottsdale, Ariz. 85257

[21] Appl. No.: 862,582

[22] Filed: Dec. 20, 1977

Related U.S. Application Data

[63] Continuation-in-part of Ser. No. 754,365, Dec. 27, 1976, Pat. No. 4,063,791.

[51] Int. Cl.² .............................................. H05K 1/04
[52] U.S. Cl. ................................ 361/403; 339/17 CF
[58] Field of Search ..................... 361/403, 408, 398; 339/75 MP, 17 CF

[56] References Cited

U.S. PATENT DOCUMENTS

| | | | |
|---|---|---|---|
| 3,597,660 | 8/1971 | Jensen | 361/398 |
| 3,757,271 | 9/1973 | Judge | 361/408 |
| 3,885,173 | 5/1975 | Lee | 361/403 |
| 4,063,791 | 12/1977 | Cutchaw | 339/75 MP |

FOREIGN PATENT DOCUMENTS 2540186 3/1977 Fed. Rep. of Germany ........... 361/408

*Primary Examiner*—David Smith, Jr.
*Attorney, Agent, or Firm*—Herbert E. Haynes, Jr.

[57] ABSTRACT

An improved integrated circuit package and connector therefor. The circuit package is provided with a flexible stripline terminal integrally extending from at least one side thereof to serve as leads by which electrical interconnection is made with the internal circuitry thereof, and the connector is for demountably attaching that package to a backpanel. The connector includes a base receptacle mounted on the backpanel for aligningly receiving the integrated circuit package so that the stripline leads are in registry with terminal pads provided on the backpanel, and the base receptacle has headed studs upstanding therefrom. A cover having apertured inclined plane means formed therein is mounted atop the base receptacle so that lateral movement of the cover receptacle relative to the base results in interaction of the studs with the inclined planes to deflect the cover downwardly and lock it in place on the base. The downward deflection of the cover exerts a force on a ring shaped pressure pad which loads the stripline leads of the package into conductive contact with the terminal pads of the backpanel.

8 Claims, 10 Drawing Figures

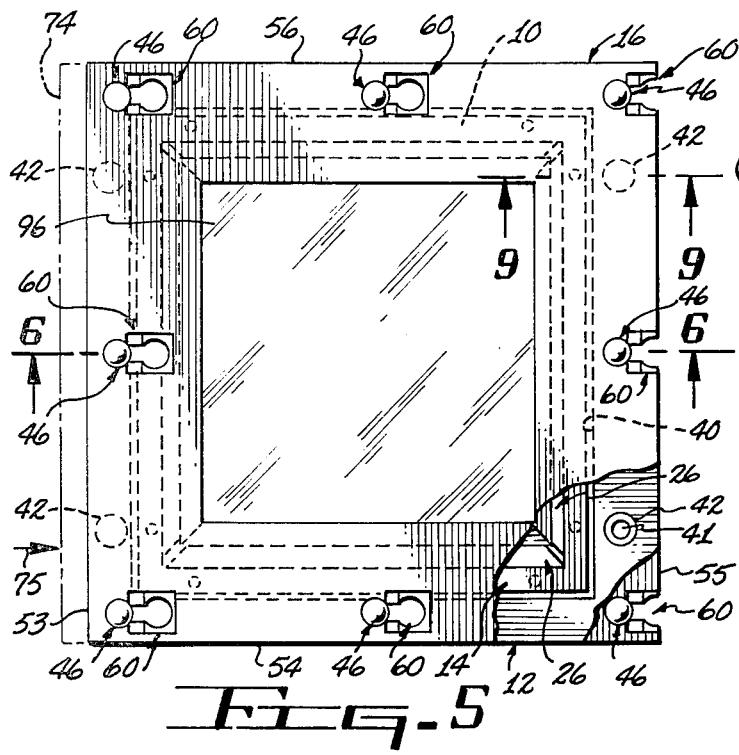
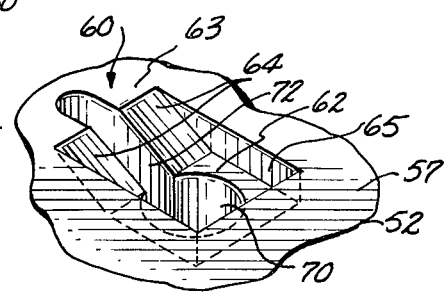
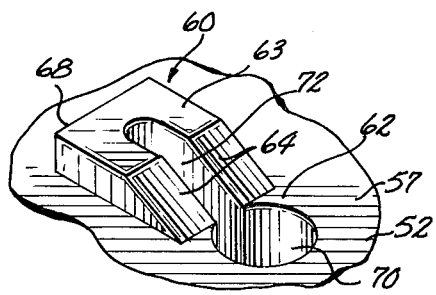
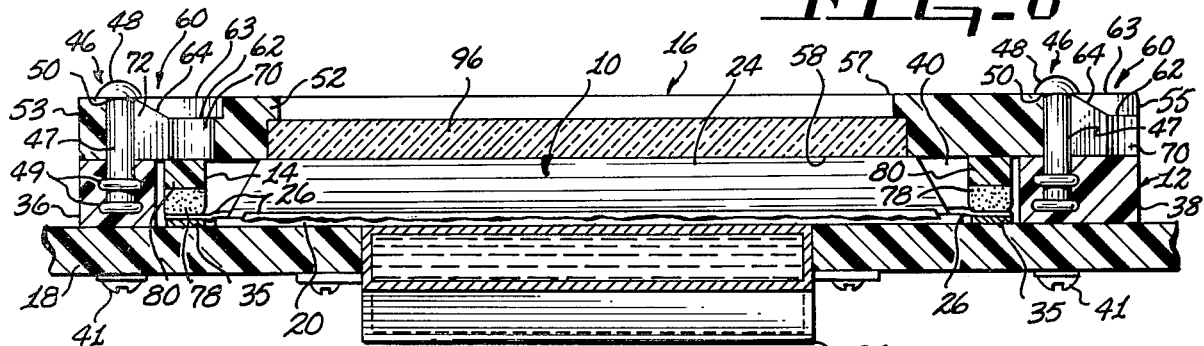
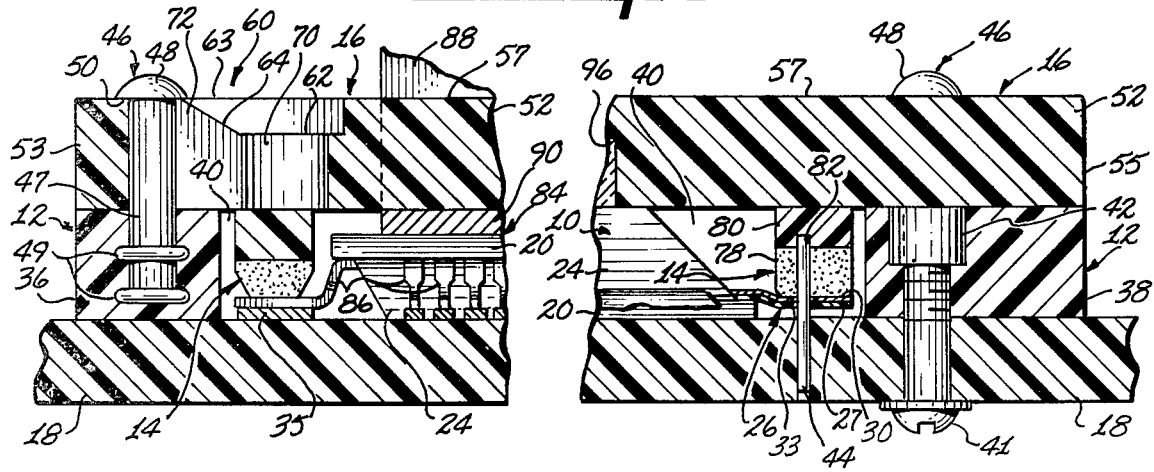

INTEGRATED CIRCUIT PACKAGE AND CONNECTOR THEREFOR

CROSS-REFERENCE TO RELATED PATENT APPLICATION

This application is a continuation-in-part of copending U.S. Patent Application Ser. No. 754,365, Filed Dec. 27, 1976, now U.S. Pat. No. 4,063,791, for: IMPROVED CONNECTOR FOR LEADLESS INTEGRATED CIRCUIT PACKAGES, by the same inventor.

BACKGROUND OF THE INVENTION

1. Field of the Invention

This invention relates to the integrated circuit art, and more particularly to an improved integrated circuit package and connector therefor.

2. Description of the Prior Art

The need for an improved integrated circuit packaging system has become critical from a profit standpoint, with companies that are trying to use highly developed electronic technology in commercial and consumer applications such as automotive, appliances, communications, industrial components, industrial systems, and the like.

The need stems from the inability of the otherwise excellent dual-in-line package (DIP) to physically meet manufacturing, testing, assembly, and servicing requirements that are being imposed thereon. This problem is due to the leads of the DIP not being strong enough for the manual and mechanical handling that they are receiving as they are being employed in a variety of new products.

This problem with the leads of integrated circuit packages, along with the desire to reduce costs, has led to the development of leadless integrated circuit packages of both the dual-in-line type and what has become known as large scale integrated circuit packages (L.S.I.). In place of leads, these leadless packages employ terminal pads located adjacent the edges of a flat ceramic substrate, and the terminal pads are connected to discrete solid state circuits mounted on the substrate. The DIP leadless package is usually rectangular and the terminal pads are located adjacent the opposite longitudinal edges. The L.S.I. substrate is square and is usually provided with terminal pads adjacent each of its peripheral edges. Specific positioning of the terminal pads is accomplished in three ways which are referred to as: face mount, side mount, and edge mount. The face mount technique places the terminal pads on one face, or planar surface of the substrate with the pads disposed adjacent to at least two edges. The side mount technique locates the terminal pads on two opposite edges of the substrate so that the pads are disposed in planes which are perpendicular to the planar surfaces of the substrate. The edge mount technique is similar to the commonly employed method used in printed circuit boards in that the pads are located on both planar surfaces of the substrate and are located adjacent the same one edge thereof.

Commericial acceptance of these leadless packages has been relatively slow due to various problems such as connectors for mounting and electrically interconnecting the packages with a backpanel such as a printed circuit board or wiring panel.

Various connector configurations have been employed or suggested for the various leadless connectors, with these prior art connectors being relatively bulky and multi-part complex structures.

A particular prior art connector, which is fully disclosed in U.S. Pat. No. 3,904,262, issued on Sept. 9, 1975, to the same inventor, includes a base receptacle mounted on a backpanel and having contact means therein which are in contact with the backpanel. The receptacle is adapted to receive the circuit package therein so that the terminal pads thereof are in alignment with the contact means provided in the receptacle. A cover is removably mounted in the receptacle and is laterally slidable relative thereto into and out of engagement with inclined plane members formed in the receptacle. When the cover is moved into engagement with the inclined plane members it will be deflected downwardly and locked in place to load the terminal pads of the circuit package into conductive contact with the contact means of the base receptacle. This connector, while constituting a substantial improvement in the art, has some drawbacks, in that the wedging action provided by engagement of the cover with the inclined plane members is exerted only on three sides of the circuit package thus making it possible for unequal pressurization of the terminal pads on the fourth side of the circuit package to occur. Further, this prior art connector requires the use of tooling to accomplish the required lateral sliding of the cover thereof.

In view of the foregoing, the need exists for a new and improved integrated circuit package and connector therefor which overcomes some of the problems of the prior art.

SUMMARY OF THE INVENTION

In accordance with the present invention, a new and improved integrated circuit package and connector for demountably connecting that circuit package to a backpanel is disclosed.

The integrated circuit package of the present invention includes a ceramic substrate having the solid state circuit mounted thereon in accordance with techniques well known in the art. The substrate and the solid state circuits are enclosed in the usual manner and are provided with flexible stripline terminals extending from the sides of the package, with the stripline terminals providing means by which electrical connection with the solid state circuits are made. The flexible stripline terminals are formed with a planar sheet of flexible dielectric material mechanically bonded to the circuit package with a plurality of electrical conductor leads bonded to one surface and a ground plane bonded to the opposite surface. The conductor leads and the ground plane of the stripline terminal are appropriately connected to the solid state circuits and extend externally of the integrated circuit package.

The connector of the present invention includes a base receptacle for mounting on a backpanel or circuit board to which the integrated circuit package is to be electrically coupled, with such backpanel or circuit board having terminal pads thereon as is well known in the art. The base receptacle is a ring shaped structure which defines a chamber for receiving the integrated circuit package of the present invention so that the conductor leads of the stripline terminals registeringly align with the terminal pads of the backpanel. The electrical interconnection between the conductor leads of the stripline terminals and the terminal pads of the backpanel is accomplished by exerting a force on the stripline terminals to pressure them into conductive contact with the terminal pads of the backpanel. The force needed to form the pressure connection is provided by a demountable cover operating in conjunction with a ring shaped pressure pad. The pressure pad rests upon the stripline terminals of the integrated circuit package. The cover has a plurality of apertured inclined plane means formed in substantially equally spaced increments adjacent the periphery thereof so that when the cover is placed atop the base receptacle, upstanding stud means provided on the base will be received by the apertured inclined plane means and downward deflection of the cover to produce an evenly applied force vector on the ring shaped pressure pad will result when the cover is slidingly moved relative to the base.

Accordingly, it is an object of the present invention to provide a new and improved integrated circuit package.

Another object of the present invention is to provide a new and improved integrated circuit package wherein electrical connection with the internal solid state circuits is made by flexible stripline terminals extending from the sides of the integrated circuit package.

Another object of the present invention is to provide a new and improved integrated circuit package of the above described character in which the stripline terminals include a flexible planar sheet of dielectric material having electrical conductor leads bonded to one surface thereof.

Another object of the present invention is to provide a new and improved integrated circuit package of the above described type in which the stripline terminals includes a flexible sheet of dielectric material having conductor leads bonded to one surface thereof and having a ground plane bonded to the opposite surface thereof.

Another object of the present invention is to provide a new and improved integrated circuit package and a connector for electrically coupling and mechanically demountably attaching that package to a backpanel.

Still another object of the present invention is to provide a new and improved integrated circuit package having flexible stripline terminals extending laterally therefrom, and a connector therefor which produces an evenly distributed force to pressurize the stripline terminals into conductive contact with the terminal pads of the backpanel.

Still another object of the present invention is to provide the combination of a new and improved integrated circuit package and connector therefor, the circuit package having flexible stripling terminals extending therefrom which are pressurized into conductive contact with the terminal pads on a backpanel by means of the connector which includes: a base receptacle for receiving the circuit package so that the stripline terminals align with the terminal pads of the backpanel, a pressure pad, and a demountable cover which movingly interacts with the base receptacle to apply the needed pressurizing force.

The foregoing and other objects of the present invention, as well as the invention itself, may be more fully understood from the following description when read in conjunction with the accompanying drawings.

BRIEF DESCRIPTION OF THE DRAWINGS

FIG. 5 is a plan view of the integrated circuit package and connector of the present invention and partially broken away to illustrate the various features thereof.

FIG. 6 is an enlarged sectional view taken on the line 6—6 of FIG. 5.

FIG. 7 is an enlarged fragmentary isometric view of a portion of the cover of the connector of the present invention.

FIG. 8 is a view similar to FIG. 7 which illustrates a modification of the cover of the connector of the present invention.

FIG. 9 is an enlarged fragmentary sectional view taken along the line 9—9 of FIG. 5.

FIG. 10 is an enlarged fragmentary sectional view showing a modification of the integrated circuit package of the present invention.

DESCRIPTION OF THE PREFERRED EMBODIMENTS

Figure 1:
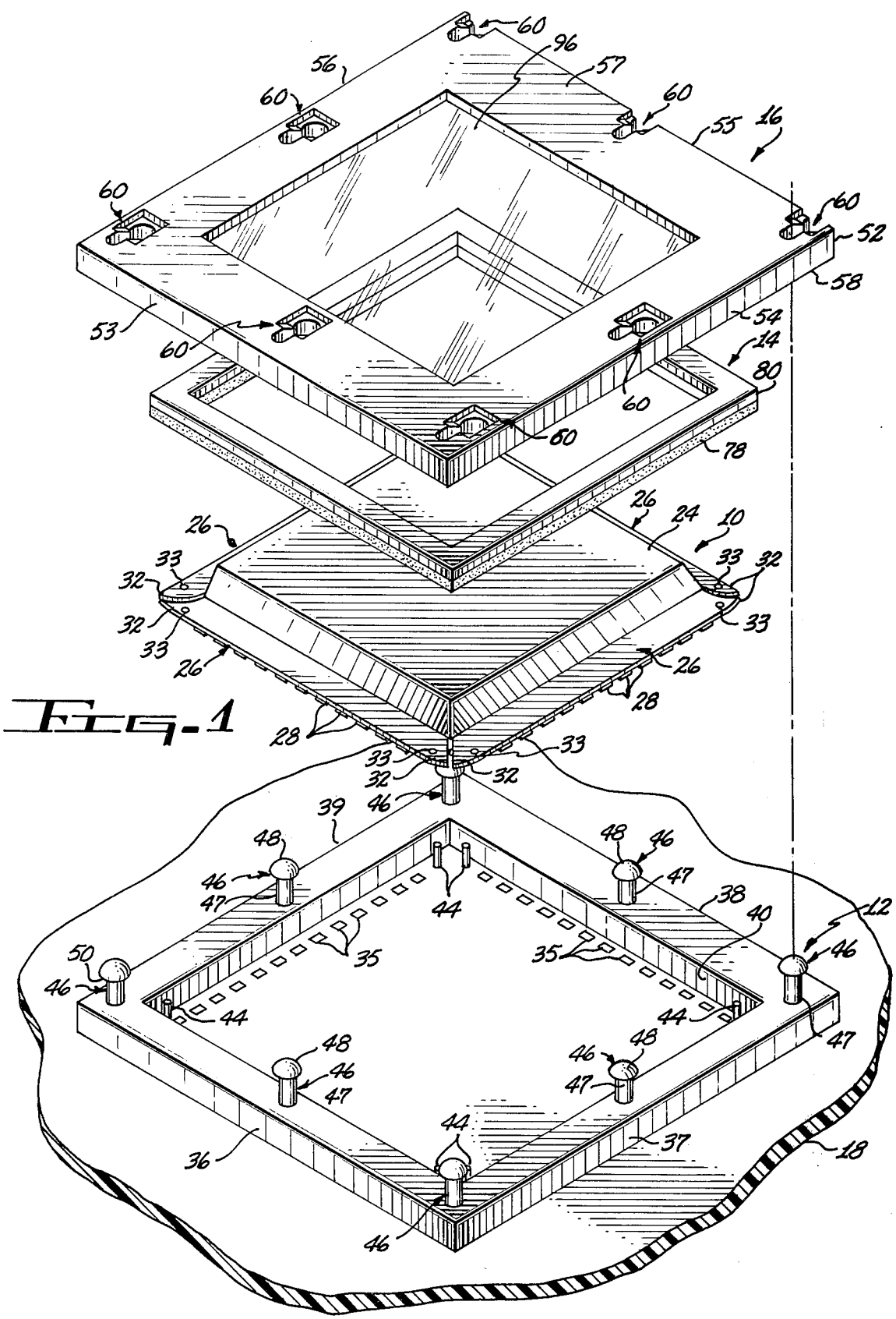
FIG. 1 is an exploded isometric view of the integrated circuit package and connector of the present invention illustrating the various features thereof.

Referring more particularly to the drawings, FIG. 1 illustrates one type of integrated circuit package of the present invention which is indicated generally by the reference numeral 10, and also illustrates the connector of the present invention which includes a base assembly or receptacle 12, pressure pad means 14, and cover assembly 16. As will hereinafter be described in detail the connector of the present invention is employed to couple the integrated circuit package 10 to a backpanel or circuit board 18.

The integrated circuit package 10 of the type shown, is oftentimes referred to as a large scale integrated circuit package (L.S.I.) and is of square configuration. Such L.S.I. packages are often further identified in accordance with their dimensions; for example, a package having a dimension of two inches per side is referred to as a 2×2 substrate, one having a dimension of three inches per side is referred to as a 3×3 substrate. In any event, such L.S.I. packages are all substantially the same insofar as fabrication, function, components, and the like are concerned.

As seen best in FIGS. 1-4, the L.S.I. package 10 includes the usual substrate 20 which, in accordance with well known technology, is formed of dielectric material and is provided with an appropriate array of conductive circuit lines 21 (one shown in FIG. 4) and ground circuit lines (not shown), which are etched or otherwise formed thereon in accordance with the electrical requirements of the particular L.S.I. package. A plurality of discrete integrated circuits 22 (one shown), referred to as chips, are bonded to the upper surface 23 of the substrate 20 and are electrically connected to the circuit lines 21, again in accordance with technology that is well known in the art. A cover 24 is employed to sealingly enclose the chips 22 and the circuit lines 21, with those lines extending laterally beyond the perimeter of the cover to serve as leads, or terminal connectors, by which electrical connection with external circuitry and components is made.

The above description relating to the L.S.I. package 10 is basic in nature and is common to all such packages, and the present invention relates in part to an improved technique and structure by which the external electrical connections are made.

The L.S.I. package 10 is provided with a stripline terminal 26 extending laterally from each side thereof, with the stripline terminals 26 serving as leads or terminations, by which the package is electrically coupled into a system, (not shown) with which it is to operate. Each of the stripline terminals 26 includes an elongated flexible sheet 27 of dielectric material, such as Kapton film, a Trademark of the E. I. duPont Co. for their polyimide material. The flexible dielectric sheet 27 is preferrably suitably affixed to the L.S.I. package such as by being bonded between the substrate 20 and the cover 24, so as to extend laterally beyond the edge of the substrate. The plurality of circuit lines 21 located internally of the L.S.I. package 10 extend laterally therefrom as hereinbefore mentioned, and will thus form a plurality of planar leads 28 which, in accordance with the present invention, are bonded, to the downwardly facing surface of the dielectric sheet 27 and are thus structurally supported thereby. In this manner, the leads 28, which are nickle plated followed by gold plating for low resistance purposes, are very tiny and fragile, will be protected from damage and entanglement. To illustrate this point, the leads 28 are usually about 0.5 mils thick, with a width dimension of about 10 mils or less, and are laterally spaced from each other on centers which are about 25 mils or less.

The stripline terminals 26 as described above will be adequate in situations where controlled impedance is not a necessary consideration. However, in many instances such as high speed digital circuits in computer systems, where low signal reflection characteristics are desirable, the stripline terminals 26 have a ground plane 30 to provide controlled impedance. The ground plane 30 of each of the stripline terminals 26 is a planar sheet of conductive material which is bonded by techniques well known in the art to the upwardly facing surface of the flexible dielectric sheet 27. As is the case with the planar leads 28, the ground plane 30 is preferrably about 0.5 mils thick and is suitably connected to an appropriate ground point or points (not shown) internally of the L.S.I. package 10.

Figure 2:
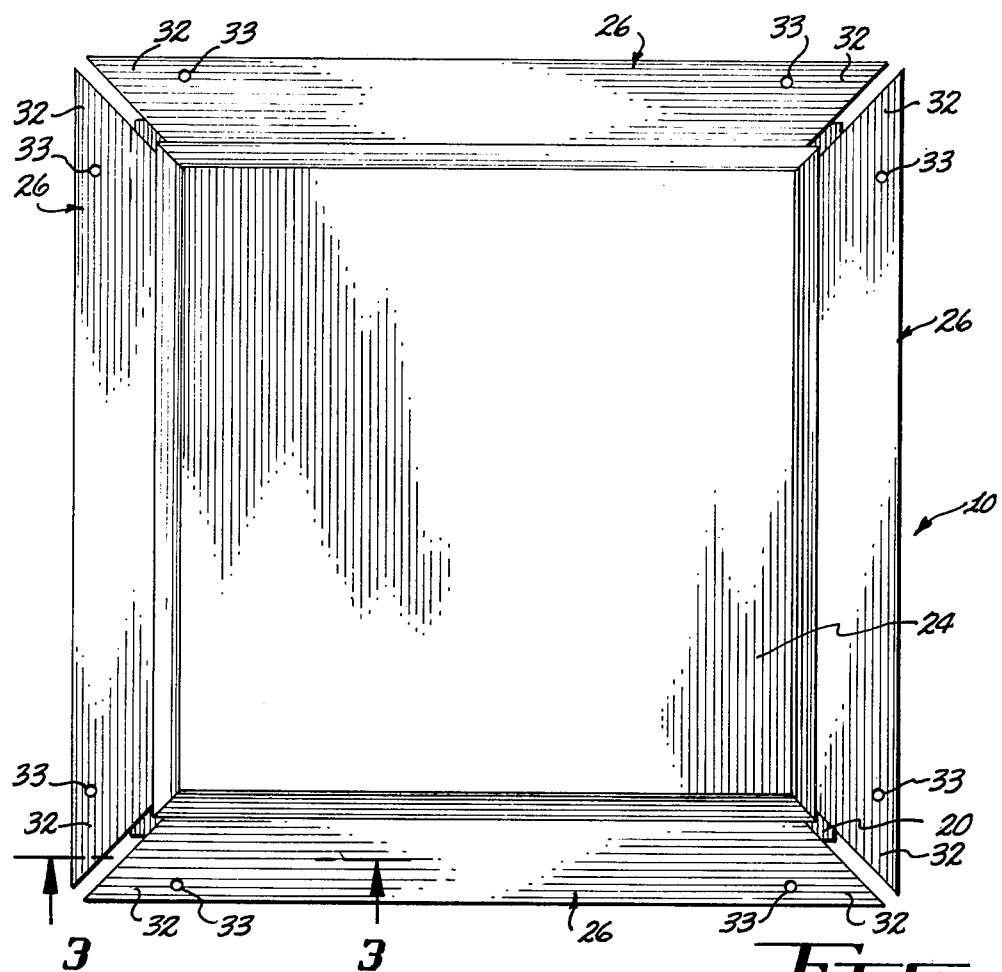
FIG. 2 is an enlarged plan view of the integrated circuit package of the present invention.
Figure 3:
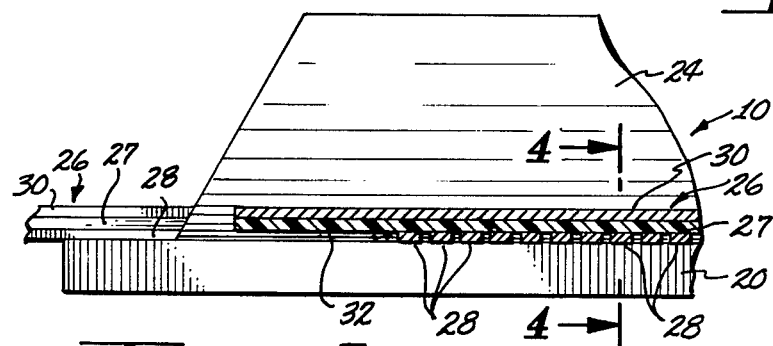
FIG. 3 is an enlarged fragmentary sectional view taken on the line 3—3 of FIG. 2.
Figure 4:
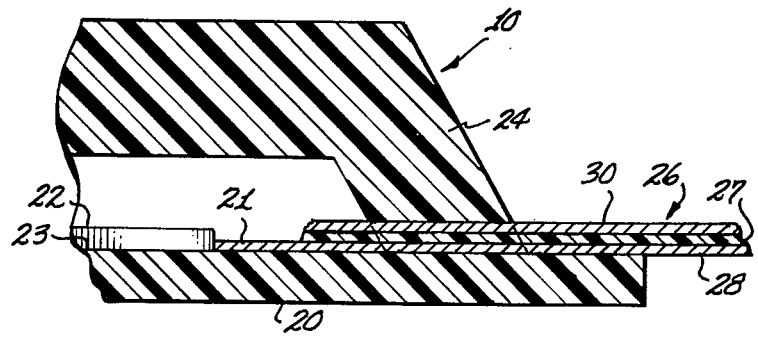
FIG. 4 is a fragmentary sectional view taken on the line 4—4 of FIG. 3.

As shown best in FIG. 2, each of the stripline terminals 26 are separated from each other so that each stripline is formed with a pair of opposite end portions 32 which are free of the planar leads 28. Those opposite end portions are employed as lift tabs and each have an aperture 33 formed therein for alignment purposes as will hereinafter be described in detail.

Although the integrated circuit package 10 of the present invention is illustrated and described as being of the L.S.I. type, it will be appreciated that the above described stripline terminal 26 may be employed on any of the well known integrated circuit packages (not shown). For example, the extensively used dual-in-line package (D.I.P.) is a generally rectangular structure having a plurality of free standing planar leads extending from each of a pair of opposite sides. In accordance with the principles of the present invention, such a DIP package (not shown) could be provided with a pair of stripline terminals 26 each extending from a different one of the opposite sides thereof. Additionally, the L.S.I. package 10 as previously described, could be formed with less than four of the stripline terminals 26 as dictated by the need for external electrical connections. Thus, the L.S.I. package 10, or any other package for that matter, could be fabricated with at least one stripline terminal 26 extending therefrom.

In any event, the integrated circuit package 10 having the stripline terminals 26 extending therefrom, will be seen to provide a structure which, in addition to protecting the individual leads 28, offers exceptionally high circuit line density possibilities, provides excellent electrical characteristics due to the controlled impedance feature provided by the ground plane 30, and all the planar leads 28 extending from one side of the package are handled as a single entity which facilitates electrical connection thereof. Another desirable characteristic of the structure of the present invention, resides in the dimensional stability and manufacturing tolerance characteristics which, due to the usage of the dielectric sheet 27, is very nearly identical to that of fiber glass which is the material of which the backpanel or circuit board 18 is fabricated.

As hereinbefore mentioned, the L.S.I. package 10 is to be mounted on the backpanel or circuit board 18, and as is customary in the art, will be electrically coupled thereto. To this end, the backpanel 18, as seen best in FIG. 1, is provided with an array of terminal pads 35 thereon which are arranged in a geometric configuration which matches that of the planar leads 28 of the stripline terminals 26 of the L.S.I. package 10 so that electrical interconnection therebetween can be effected.

It is conceivable that the leads 28 of the L.S.I. package 10 could be soldered or otherwise fixedly bonded to the terminal pads 35 of the backpanel 18 to achieve such electrical interconnection. However, for reasons of serviceability, component replaceability and the like, it is preferred that the planar leads 28 of the L.S.I. package 10 be mechanically pressurized into conductive contact with the terminal pads 35 of the backpanel 18.

As seen best in FIGS. 1, 5 and 6, the base assembly 12 of the connector of the present invention, is of square ring configuration and has upstanding side walls 36, 37, 38 and 39 which form an endless structure which defines the perimeter of an open chamber 40. The base assembly 12 is formed of a suitable dielectric material such as polycarbonate, polypropylene, and the like, and is fixedly mounted on the backpanel 18 such as by screws 41 which pass upwardly through the backpanel 18 and threadingly engage captive nuts 42 imbedded within the base assembly. With the base assembly 12 thus fixedly mounted to the backpanel 18, the array of terminal pads 35 of the backpanel 18 will be displayed within the open chamber 40 of the base assembly 12.

As will become apparent as this description progresses, relatively large forces will exist when the leads 28 of the stripline terminals 26 are pressure connected to the terminal pads of the backpanel 18, and therefore, it is recommended that the material of which the base assembly 12 is fabricated, be reinforced such as with glass fibers. The open chamber 40 formed in the base assembly 12 is adapted to receive the L.S.I. package 10 therein with the conductor leads 28 of the stripline terminals 26 in vertical alignment with the terminal pads 35 of the backpanel 18. To insure precise vertical alignment, the backpanel 18 is provided with alignment, or registration pins 44, which are disposed so that a pair of such pins 44 are precisely located so as to extend upwardly from the backpanel 18 into each corner of the open chamber 40 of the base assembly 12. In this manner, when the L.S.I. package 10 is lowered into the open chamber 40, the perviously described alignment apertures 33 formed in the stripline terminals 26 will each receive a different one of the upstanding registration pins 44 therein, thus insuring precise alignment.

In the connector of the present invention, the force necessary to achieve a pressure connection between the conductor leads 28 of the stripline terminals 26 and the terminal pads 35 of the backpanel 18 is derived from the manner in which the cover assembly 16 is mounted on the base assembly 12.

Toward this end, a plurality of upstanding stud means 46 are mounted, as will hereinafter be described, in the base assembly 12. The studs 46 extend normally from the side walls 36, 37, 38 and 39 of the base assembly 12 and are arranged in substantially equally spaced increments about the chamber 40 thereof. In the preferred embodiment, the studs 46 are eight in number, with different ones of those studs being located at each corner of the base assembly and intermediate the ends of each of the side walls 36–39 thereof.

Each of the stud means 46 is provided with a shank 47 having an enlarged head 48 on the upper end, and the studs may be affixed to the base assembly in any suitable manner, such as by being molded therein. If such a method of affixation is employed, the studs 46 may be provided with annular protrusions 49 (FIG. 6) on the shank 47 which serve as anchors to prevent the studs from being pulled out of the base assembly 12. An alternate form of stud and mounting means (not shown) would be to provide the shank of the stud with threads on the lower end thereof for threaded engagement with captive nuts (not shown) suitably carried in the base assembly 12.

In any event, the stud means 46 are each configured to provide a shoulder 50 on the downwardly facing surface of the enlarged head 48, with those shoulders serving as cover deflecting and retaining means as will hereinafter be described in detail.

The cover assembly 16 comprises a body 52 which is a planar structure configured to mount atop the base assembly 12, and thus may be formed in a geometric shape and size which substantially matches that of the base assembly 12. In the illustrated embodiment, the cover body 52 is a substantially square structure having side edges 53, 54, 55 and 56 and having an upper planar surface 57 and a lower planar surface 58.

A plurality of apertured inclined plane means 60 are formed in the cover body 52 with there being one of those apertured inclined plane means 60 for each of the stud means 46 of the base assembly 12. Thus, in the preferred embodiment, the apertured inclined plane means 60 are eight in number with different ones thereof being located at each corner of the cover 16 and midway between the ends of each of the side edges 53–56 of the cover.

Each of the apertured inclined plane means 60 includes a special surface configuration formed in the cover body 52 which, as seen best in FIG. 7, comprises a lower surface 62, an upper surface 63 which is laterally spaced from the lower surface, and an inclined plane surface 64, or ramp, which extends between the lower surface 62 and the upper surface 63. As seen, the lower surface 62 is provided by forming a cavity 65 which is recessed below the upper planar surface 56 of the cover 16, and that the upper surface 63 is actually a portion of the upper planar surface 57 of the cover body 52. However, although that particular arrangement is preferred, FIG. 8 illustrates another method of accomplishing the same objective. In the modification shown in FIG. 8, the lower surface 62 is actually a portion of the upper planar surface 57 of the cover body 52, and the upper surface 63 is provided by molding or otherwise forming a pedestal 68 on the cover body 52 with the upper surface 63 being the top of the pedestal, and the inclined plane surface 64 forming one side thereof.

In either case, each of the apertured inclined plane means 60, further comprises a keyhole shaped aperture formed through the cover body 52, with the aperture including an enlarged portion 70 and a laterally extending narrowed slot 72. The enlarged portions 70 of the keyhole apertures open upwardly onto the lower surface 62 and are sized to be somewhat larger than the heads 48 of the upstanding studs 46 so that when the cover assembly 16 is placed atop the base assembly 12, the upstanding studs 46 will each enter an aligned one of those enlarged portions 70, with the heads 48 of the studs 46 being disposed above the lower surface 62 formed on the cover body 52. The narrowed slots 72 of the keyhole apertures each open upwardly onto the inclined plane surface 64 and onto the upper surface 63, and each have a width dimension which is somewhat larger than the diameter of the shanks 47 of the stud means 46 to permit lateral sliding of the cover assembly 16 relative to the base assembly 12 as will hereinafter be described in detail.

As best seen in FIG. 5, the narrowed slots 72 of each of the keyhole aperturs extend in the same direction, i. e., extend toward the side edge 53 of the cover body 52. Thus, when the cover assembly 16 is placed atop the base assembly 12, stud means 46 will enter into the aligned apertured inclined plane means 60 by passing upwardly in the enlarged portions 70. Such placement of the cover 16 on the base 12 will locate the enlarged heads 48 of the studs 46 above the lower surface 62 of the apertured inclined plane means 60. In that state, the cover 16 will be spaced above the base assembly 12, and will be laterally offset with respect thereto, as shown in dotted lines 74 in FIG. 5. Lateral sliding movement of the cover 16 in the direction of the arrow 75 (FIG. 5) will move the keyhole apertures relative to the stud means 46 so that the narrowed slots 72 are moved into a straddling position relative to the shanks 47 of the studs 46. Such movement will bring the inclined plane surfaces 64 into wedged engagement with the shoulders 50 of the studs 46, and thereby cause downward deflection of the cover assembly 16. Such downward cover deflection will move the cover assembly 16 into bearing engagement with the pressure pad means 14 which transmits the downwardly directed force to the stripline terminals 26 of the L.S.I. package 10 to move the conductor leads 28 thereof into pressurized conductive contact with their respective vertically aligned ones of the terminal pads 35 of the backpanel 18. When the inclined plane surfaces 64 of the apertured inclined plane means 60 have passed completely beneath the heads 48 of the studs 46, the shoulders 50 will bear against the upper surfaces 63 and thus, the cover will be lockingly held in the downwardly deflected position.

It should be noted that the inclined plane surfaces 64 should be configured with a length to height ratio of at least 3:1 and preferably 5:1 or more, to provide a mechanical advantage that is high enough to facilitate lateral sliding movement of the cover 12.

Removal of the cover assembly 16 such as could be required for servicing and replacement of the L.S.I. package 10, is accomplished by simply laterally moving the cover assembly in the direction opposite to that indicated by the arrow 75 (FIG. 5), such action will reverse the movements hereinbefore described with reference to the mounting of the cover assembly 16 on the base assembly 12, and when such movements have been completed the cover may be lifted from the base assembly.

As best seen in FIGS. 1, 6 and 9, the pressure pad means 14 is of square ring configuration and is sized to circumscribe the L.S.I. package 10 and to be circumscribed by the upstanding side walls 36–39 of the base assembly 12. Thus, the pressure pad means 14 is configured to freely rest atop the stripline terminals 26 of the L.S.I. package 10. In the preferred embodiment, the pressure pad means 14 is a laminated structure having an elastomeric portion 78 bonded to the downwardly facing surface of a rigid supporting portion 80. The elastomeric portion 78 provides the pad 14 with a conformability capability and insures an even distribution of the forces transmitted thereby. The rigid supporting portion 80 may be fabricated of any suitable material, such as plastic, which in addition to supporting the elastomeric portion 78, will provide a smooth upper surface so that the cover assembly 16 will be free to slide thereon, during mounting of the cover on the base, and therefore will not cause any displacing movement of the pad 14.

It will be noted that many variations of pressure pad configuration could be employed without impairing the function of that element. In face, some variations of the pressure pad means 14 could be employed to enhance its performance. For example, the pressure pad means 14 could be formed into four separate segments (not shown) without impairing its function, the elastomeric portion 78 could be formed into a chisel point, as shown in FIG. 10, to concentrate the forces transmitted thereby, and the elastomeric portion 78 could be formed with transversely disposed spaces (not shown) to form that portion into a plurality of land areas (not shown) which would align with the conductor leads 28 of the stripline terminals 26. Also, the pressure pad means 14 could be formed as an integral part of the L.S.I. package 10 by simply bonding the pad 14 to the upper surface of the stripline terminals 26, or by attaching the pad to the cover 24 of the package 10.

As shown in FIG. 9, the pressure pad means 14 is preferrably provided with registration apertures 82 (one shown), with there being a pair of such apertures 82 located in each corner of the pressure pad means 14. The registration apertures 82 are disposed so that when the pressure pad means 14 is assembled atop the stripline terminals 26 within the connector, the registration pins 44 carried by the backpanel 18 will engage the apertures 82 thus holding the pressure pad 14 in the properly aligned position.

Referring now to FIG. 10 wherein the connector of the present invention is shown as electrically coupling a modified form of L.S.I. package 84 to the backpanel 18. The L.S.I. package 84, instead of being provided with the stripline terminals previously described in reference with the L.S.I. package 10, is provided with a plurality of free standing conductor pins 86. The pins 86 are of the type commonly employed in a well known type of integrated circuit package referred to as a dual-in-line package (not shown), and the pins are pressurized into conductive contact with the terminal pads 35 of the backpanel 18 in the manner previously described.

As is well known in the art, integrated circuit packages are capable of generating a considerable amount of heat while operating, and this heat can destroy such packages in the absence of means for dissipation thereof. Therefore, the cover body 52 may be provided with heat conducting and radiating means in the form of a plurality of fins 88, such as of copper or other heat conductive material. The fins 88 are provided with a package engaging portion 90 from which the fins extend upwardly through the cover body 52 so that heat from the package is dissipated into the atmosphere. Such a means for dissipating heat is ideally employed when the L.S.I. package is mounted with the substrate thereof facing upwardly, as shown in FIG. 10. However, as shown in FIG. 9, when the L.S.I. package is positioned so that the substrate thereof is in engagement with the surface of the backpanel 18, the fin arrangement for dissipating heat cannot be employed.

When the L.S.I. package is mounted with the substrate thereof in contact with the backpanel 18, heat produced by the L.S.I. package may be collected and dissipated by employing a suitable liquid circulating system, which, as seen in FIG. 6, may include a liquid circulating tube 94 mounted in the circuit board so as to be in thermally conductive contact with the substrate 20 of the L.S.I. package 10.

When the cover assembly 16 does not include the fins 88, it may be provided with a centrally located sheet of transparent material 96 so as to form a window for display purposes in the event that the L.S.I. package 10 is provided with light emitting diodes, liquid crystal display and the like, or the window may be simply employed so that the integrated circuit package mounted within the connector of the present invention may be readily identified.

While the principles of the invention have now been made clear in an illustrated embodiment, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits only of the true spirit and scope of the invention.

What I claim is:

1. A connector for removably mounting an integrated circuit package having laterally extending conductive leads on a backpanel and electrically coupling the conductive leads thereof to the terminal pads provided on the backpanel, said connector comprising:
    (a) a housing for mounting on the backpanel, said housing having endless upstanding side walls which form the perimeter of an open chamber into which the integrated circuit package is nestingly positionable with the conductive leads thereof in aligned engagement with the terminal pads of the backpanel;
    (b) pressure pads means mountable in the open chamber of said housing so as to rest on the conductive leads of the circuit package when that package is positioned in said housing, said pressure pad disposed to extend above the side walls of said housing;
    (c) a plurality of stud means mounted on said housing in substantially evenly spaced increments so as to be upstanding from the side walls thereof in an array which surrounds the open chamber of said housing; and (d) a cover positionable above said housing in overlaying relationship with respect to the sidewalls thereof and in engagement with that portion of said pressure pad means which extends above the side walls of said housing when said pressure pad means is mounted in said housing, said cover being laterally and downwardly movable relative to said housing for exerting a downwardly directed force on said pressure pad means when that pressure pad means is mounted in the open chamber of said housing, said cover having a plurality of apertured inclined plane means formed therein for receiving said stud means when said cover is positioned above said housing and which move into engagement with said stud means upon lateral movement of said cover to cause downward deflection thereof.

2. A connector as claimed in claim 1 wherein each of said plurality of apertured inclined plane means formed in said cover comprises:
   (a) a lower surface formed on said cover;
   (b) an upper surface formed on said cover and laterally spaced from said lower surface;
   (c) an inclined plane surface extending angularly between said lower surface and said upper surface; and
   (d) said cover having a keyhole shaped aperture formed therethrough, said aperture having an enlarged portion which opens upwardly onto said lower surface and having a narrowed slot which opens upwardly onto said inclined plane surface and onto said upper surface.

3. A connector as claimed in claim 1 wherein each of said plurality of apertured inclined plane means formed in said cover comprises:
   (a) a lower surface forming the bottom of a recessed cavity provided in the upper planar surface of said cover;
   (b) an inclined plane surface formed in said cover so as to extend laterally angularly and upwardly from said lower surface to the upper planar surface of said cover; and
   (c) said cover having a keyhole shaped aperture formed therethrough, said aperture having an enlarged portion which opens upwardly onto said lower surface and having a narrowed slot which opens upwardly onto said inclined plane surface and onto the upper planar surface of said cover.

4. A connector as claimed in claim 1 wherein each of said plurality of apertured inclined plane means formed in said cover comprises:
   (a) an upstanding pedestal formed on said cover and having an upper surface;
   (b) an inclined plane surface forming one side of said pedestal, said inclined plane surface extending laterally angularly and downwardly from the upper surface of said pedestal to the upper planar surface of said cover; and
   (c) said cover having a keyhole shaped aperture formed therethrough, said aperture having an enlarged portion which opens upwardly onto the upper planar surface of said cover adjacent said inclined plane surface and having a narrowed slot which opens upwardly onto said inclined plane surface and onto the upper surface of said pedestal.

5. A connector as claimed in claim 1 wherein each of said stud means comprises:
   (a) a shank portion affixed to said housing and upstanding therefrom; and
   (b) an enlarged head on the upwardly extending end of said shank.

6. A connector as claimed in claim 1 wherein said cover is provided with a plurality of upstanding fins for dissipation of heat.

7. A connector as claimed in claim 1 wherein said cover is provided with a sheet of transparent material located centrally therein to provide a window therethrough.

8. A connector as claimed in claim 1 wherein said pressure pad means comprises:
   (a) a lower portion of elastomeric material; and
   (b) an upper portion bonded to said lower portion, said upper portion formed of rigid material.

* * * * *